United States Patent [19]
Davidson

[11] Patent Number: 5,945,251
[45] Date of Patent: Aug. 31, 1999

[54] PROCESS FOR PRODUCING PURIFIED SOLUTIONS OF BLOCKED POLYHYDROXYSTYRENE RESINS

[75] Inventor: James M. Davidson, Corydon, Ind.

[73] Assignee: Olin Corporation, Norwalk, Conn.

[21] Appl. No.: 09/074,805

[22] Filed: May 8, 1998

[51] Int. Cl.$^6$ ..................................................... G03C 1/73
[52] U.S. Cl. ...................... 430/270.1; 523/328; 524/317; 524/364; 524/475
[58] Field of Search ..................... 430/270.1; 524/364, 524/317, 475; 523/328

[56] References Cited

U.S. PATENT DOCUMENTS

| | | | |
|---|---|---|---|
| 5,473,045 | 12/1995 | Sizensky et al. | 528/129 |
| 5,565,304 | 10/1996 | Honda | 430/311 |
| 5,618,655 | 4/1997 | Davidson | 430/347 |
| 5,817,444 | 10/1998 | Sato et al. | 430/155 |

FOREIGN PATENT DOCUMENTS

| | | |
|---|---|---|
| 0718316 A2 | 6/1996 | European Pat. Off. . |
| 0738744 A2 | 10/1996 | European Pat. Off. . |

*Primary Examiner*—Janet Baxter
*Assistant Examiner*—Barbara Gilmore
*Attorney, Agent, or Firm*—Ohlandt, Greeley, Ruggiero & Perle

[57] ABSTRACT

1. A process for preparing a purified solution of blocked polyhydroxystyrene resin in reaction/photoresist solvent, comprising the steps of:

(1) forming an impure reaction solution comprising blocked polyhydroxystyrene resin and acidic catalyst in reaction/photoresist solvent;

(2) adding amine, at least one hydrophilic solvent, at least one hydrophobic solvent and water to said impure reaction solution, thereby forming an aqueous phase comprising water, the hydrophilic solvent, and at least one salt of the amine and the acidic catalyst and an organic phase comprising the hydrophilic solvent, the hydrophobic solvent, the reaction/photoresist solvent and the blocked polyhydroxystyrene resin;

(3) separating the aqueous phase from the organic phase; and (4) removing the hydrophilic solvent and the hydrophobic solvent from the organic phase, thereby forming a purified solution of blocked polyhydroxystyrene resin in reaction/photoresist solvent.

11 Claims, No Drawings

PROCESS FOR PRODUCING PURIFIED SOLUTIONS OF BLOCKED POLYHYDROXYSTYRENE RESINS

BACKGROUND OF THE INVENTION

1. Field of the Invention

The present invention is directed to a process for producing purified solutions of blocked polyhydroxystyrene resins or purified solutions of blocked, crosslinked polyhydroxystyrene resins. These purified solutions are useful in making chemical amplified photoresist formulations.

2. Brief Description of the Art

Polyhydroxystyrene resins where some or all of the hydroxy groups in the resin are converted into acid-labile protecting groups ("blocked resins") are commonly used as polymeric materials in chemically amplified photoresists. These chemically amplified photoresists are employed in advanced photolithographic processes of semiconductor fabrication.

Crosslinked polyhydroxystyrene resins having some or all of the hydroxy groups converted to acid-labile protecting groups and also possessing crosslinking moieties ("blocked, crosslinked polymers") are also well known. See, for example, European Published Patent Application Nos. 0718316 A2, published on Jun. 26, 1996, and 0738744 A2, published on Oct. 23, 1997. Both of these published European Patent Applications are incorporated herein by reference in their entireties. These blocked, crosslinked polyhydroxystyrene resins are employed instead of or in conjunction with blocked resins as the polymeric materials in chemical amplified photoresists.

In making these blocked resins or these blocked, crosslinked polyhydroxystyrene resins, the precursors (e.g., the polyhydroxystyrene, the protecting group precursor and, optionally, the crosslinking agent) have been reacted together in the presence of an acid catalyst and suitable organic reaction solvent to form an impure solution of the blocked polymer or the blocked, crosslinked polymer in the reaction solvent. After the reaction was complete, the reaction mixture was then passed through a bed of strong base ion exchange resin to remove the acid catalyst. The treated reaction solution was then combined with deionized water or a mixture of deionized water and an alcohol (e.g., ethanol or isopropanol) to precipitate the blocked resin or blocked, crosslinked resin in solid form. The precipitated solid resin was then separated from the reaction mixture, preferably by filtration or centrifugation. The separated resin was then washed with more deionized water and then vacuum dried. The dried, solid blocked resin or blocked, crosslinked resin was later dissolved in a suitable organic photoresist solvent and then used to make a chemical amplified photoresist formulation.

This prior art method of making these blocked resins and blocked, crosslinked resins has several disadvantages associated with it, including:

(1) The resin bed employed to remove the acid catalyst must have a very low trace metals content. This need can be met by only either using a high purity and expensive ion exchange resin or using a special cleanup procedure for standard ion exchange resins after each run. Furthermore, the ion exchange resin bed must be very dry (i.e., contain no water therein) when the reaction mixture is passed through it. Otherwise, the water (in the presence of the catalyst or ion exchange resin) may hydrolyze the blocked polymer. Still further, in some cases, the ion exchange resin may act as a catalyst for unwanted reactions or may retain some of the blocked polymer or blocked, crosslinked polymer, thereby reducing the yield of the blocked polymer or blocked, crosslinked polymer. And, in any case, the employment of the ion exchange resin also requires cleanup and disposal.

(2) The phase change precipitation step requires a large amount of water (i.e., at least 20 times the weight of the reaction mixture). The use of smaller amounts of water will result in sticky solids that adhere to the sides of the precipitation vessel. The large amount of water results in a large quantity of wastewater that must be disposed of. Also, a large and costly precipitation vessel must be employed.

(3) The separation step requires special and costly filtration and centrifugation equipment. Handling these solids during and after this separation step is a potential source of contamination because it is almost impossible to keep these solids isolated from the environment.

(4) The drying of the solids is another potential source of contamination, both from the dryer equipment itself and the handling required to load and unload the dryer. Also, drying may cause unwanted side reactions in the product to occur.

Accordingly, there is a need for an improved process for preparing pure blocked resins or pure blocked, crosslinked resins without the above disadvantages of the prior art. The present invention offers such a process. In particular, the process of the present invention reduces waste generation, reduces the probability of product contamination and eliminates solids handling. This process allows for the purified resin to be directly dissolved in the photoresist solvent rather than having this purified resin put in solid form and then redissolved in the photoresist solvent.

BRIEF SUMMARY OF THE INVENTION

Accordingly, one aspect of the present invention is directed to a process for preparing a purified solution of blocked polyhydroxystyrene resin in reaction/photoresist solvent, comprising the steps of:

(1) forming an impure reaction solution comprising blocked polyhydroxystyrene resin and acidic catalyst in reaction/photoresist solvent;

(2) adding amine, at least one hydrophilic solvent, at least one hydrophobic solvent and water to said impure reaction solution, thereby forming an aqueous phase comprising water, the hydrophilic solvent and at least one salt of the amine and the acidic catalyst and an organic phase comprising the hydrophilic solvent, the hydrophobic solvent, reaction/photoresist solvent and the blocked polyhydroxy-styrene resin;

(3) separating the aqueous phase from the organic phase; and (4) removing the hydrophilic solvent and the hydrophobic solvent from the separated organic phase, thereby forming a purified solution of blocked polyhydroxystyrene resin in the reaction/photoresist solvent.

DETAILED DESCRIPTION OF THE PREFERRED EMBODIMENTS

The term "reaction/photoresist solvent" as used in the present specification and claims refers to any single solvent or mixture of solvents that could be used both as a solvent for the reaction to form blocked polyhydroxystyrene resins or blocked, crosslinked polyhydroxystyrene resins, as well as a solvent for chemically amplified-type photoresists in which the blocked resins or the blocked, crosslinked resins are one component thereof.

The term "blocked polyhydroxystyrene resins" as used in the present specification refers to any and all polyhydroxystyrene resins that have some or all of the hydroxy groups in the resin converted to protecting groups (e.g., vinyl ether groups) and are useful in chemically amplified-type photoresists. The term "blocked polyhydroxystyrene resins" as used herein encompasses resins of the class "blocked, crosslinked polyhydroxy styrene resins".

The term "blocked, crosslinked polyhydroxy-styrene resins" as used in the present specification and claims refers to any and all polyhydroxystyrene resins that have some or all of the hydroxy groups in the resin converted to protecting groups (e.g., vinyl ether groups) and also contain crosslinking moieties linking separate polymeric claims and are useful in chemically amplified-type photoresists.

The phrase "impure solution of blocked polyhydroxystyrene resin in reaction/photoresist solvent" as used in the present specification and claims refers to any and all solutions containing blocked polyhydroxystyrene resins in a single reaction photoresist solvent or mixture of solvents and further contain unacceptable amounts of impurities and/or reaction by-products and/or unreacted reaction precursors.

The phrase "purified solution of blocked polyhydroxystyrene resin in reaction/photoresist solvent" as used in the present specification and claims refers to any and all solutions containing blocked polyhydroxystyrene resins in reaction/photoresist solvent or mixture of solvents and further contains acceptably low amounts of impurities so that the purified solution may be used in chemically amplified-type photoresists.

The first step of the present invention is directed to forming an impure reaction solution containing the blocked polyhydroxystyrene resin and acidic catalyst in reaction/photoresist solvent or solvents.

This impure reaction solution is preferably prepared by adding the desired amounts of at least one polyhydroxystyrene resin, at least one protecting group precursor, the acid catalyst and, optionally, at least one crosslinking agent to a reactor containing the reaction/photoresist solvent and then heating this reaction mixture to desired reaction temperature for a sufficient amount of time to produce the blocked polyhydroxystyrene resin or the crosslinked, blocked polyhydroxystyrene resin in the reaction mixture.

The polyhydroxystyrene resins useful for this process would include any polymeric resin that contains hydroxystyrene repeating units, including poly(4-hydroxystyrene) homopolymers, poly(4-hydroxy-α-methylstyrene) homopolymers and poly(3-hydroxystyrene) homopolymers or co-polymers formed from hydroxystyrene-containing monomers (e.g., 4-hydroxystyrene) with other monomers such as acrylic acid, methacrylic acid, alkyl methacrylates, alkyl acrylates, styrene, fumaronitrile, vinylcyclohexanol, maleic anhydride, maleimide and derivatives thereof or mixtures of such homopolymers or copolymers. Preferred polyhydroxystyrene resin precursors include those disclosed in European Patent Applications Nos. 718316 and 738744.

The protecting group precursors added to this reaction mixture and any such compounds capable of forming an acid-labile protecting or blocking group on the hydroxy groups in the side chain of the polyhydroxystyrene resin. These preferably include vinyl ethers (e.g., tert.-butylvinyl ether or ethylvinyl ether), carbonates (e.g., tert.-butyl carbonate) or other precursors to suitable acid-labile protecting groups including silyl ether, cumyl ester, tetrahydropyranyl ester, tetrahydropyranyl ester, enol ether, enol ester, tert.-alkyl ether, tert.-alkyl ester, tert.-alkyl carbonate, acetal and ketal groups. Mixtures of protecting group precursors may also be added to the reaction mixture.

The optional cross-linking agent or agents may include any suitable chemical agent that crosslinks polyhydroxystyrene in a desirable way to achieve a suitable resin for a photoresist application. One preferred crosslinking agent is 4,4'-isopropylidene dicyclohexanol.

This reaction is carried out in the presence of an acidic catalyst. Examples of suitable acidic catalysts include acidic ionic exchanger resins or acids such as sulfonic acids (preferably, toluene sulfonic acid) or salts thereof, for example, pyridinium tosylate.

The reaction is also carried out in the presence of a suitable reaction solvent. As mentioned above, this solvent must not only be suitable for this reaction, but also be suitable as a solvent or a co-solvent for the resulting photoresist composition. Ether solvents are particularly preferred with the most preferred being propylene glycol methyl ether acetate (PGMEA). The ordinary skilled artisan in the photoresist field would be able to choose an appropriate solvent or solvent mixture based on the particular resin and photoresist formulation involved, as well as the specific application for that photoresist.

This reaction is generally carried out at reaction temperatures from about 10° C. to about 80° C. for a sufficient amount of time so that sufficient conversion of the hydroxyl groups to protecting groups and optional resin crosslinking occurs. The reaction is generally carried out in any standard reactor apparatus, preferably a glass or Teflon-lined reactor to prevent an increase in cationic and anionic impurities in the reaction mixture.

The relative percentages of the resin precursors added to the reactor will depend upon the final desired characteristics of the resin. Generally, the resultant blocked polyhydroxystyrene or blocked, crosslinked polyhydroxystyrene resins will preferably have a weight-average molecular weight of from 1,000 to 1,000,000; more preferably from about 3,000 to about 500,000 and most preferably from about 6,000 to about 100,000. The percentage of hydroxy groups in the polyhydroxystyrene resin precursor converted to acid-labile protecting groups will generally be from about 5% to about 95%, more preferably, from about 10% to 50. The degree of crosslinking [v=o/m+n+o] will preferably be from 0.001 to 0.5, more preferably, from 0.002 to 0.2, wherein m is the average number of acid-cleavable protecting groups per resultant resin molecule; n is the sum of COOH groups and phenolic hydroxyls per resultant resin and o is the number of bridging groups per resultant resin.

After the resin-forming reaction is complete, at least one hydrophilic solvent and at least one hydrophobic solvent are added to the impure reaction mixture, along with water and an amine compound. Their addition results in the formation of organic phase and aqueous phase in the resulting mixture.

The hydrophilic solvent is preferably a ketone such as acetone and is added because of its hydrophilic nature (i.e., its ability to dissolve impurities in both the organic and aqueous phases). The hydrophobic solvent is preferably a hydrocarbon such as hexane and is employed because of its hydrophobic nature and its ability to dissolve impurities in the organic phase. Generally, the relative amounts of hydrophilic solvent and hydrophobic solvent are from 20:1 to 1:20 by weight.

The combination of acetone and hexane is particularly preferred because these solvents each are capable of aiding the solubility of the blocked resin; each have low densities (so that the resultant organic phase has a density less than water) and each has a lower boiling point than conventional photoresist solvents such propylene glycol monomethyl ether acetate (PGMEA). In all, this combination has been found to provide a good organic phase and aqueous phase separation when PGMEA is the reaction/photoresist solvent and are easily removable from PGMEA by rotary evaporation or distillation because of their lower boiling points.

The relative amount of water is preferably about 1:10 to about 10:1 of the total mount of organic solvents.

The amount of amine is preferably sufficient to neutralize the amount of acidic catalyst present. Any conventional amine useful for this purpose may be used. Triethylamine is particularly preferred.

Next, the resulting organic phase is separated from the aqueous phase. This is generally accomplished by a simple phase separation operation. The bottom aqueous phase is normally drawn out of the reactor, leaving the organic phase in the reactor.

Preferably, after this phase separation, additional water washes are optionally carried out. This encompasses adding an amount of water and optionally, more hydrophilic solvent to the reactor, allowing the reaction mixture to settle and then removing the added water. Generally, it is preferred to conduct at least one water wash operation.

After the phase separation step and any optional water washes, the hydrophilic and hydrophobic solvents are removed from the reaction mixture. Preferably, this is accomplished by simple distillation whereby the reaction mixture is heated to a temperature that distills off those two solvents and leaves a final purified reaction mixture comprised of the reaction/photoresist solvent and the blocked polyhydroxystyrene resin or crosslinked blocked polyhydroxystyrene resin.

A photoresist composition can be prepared by simply adding other photoresist components such as at least one photoacid generator, at least one optional dissolution inhibitor and, if desired, more reaction/photoresist solvent and/or other photoresist solvents to this purified solution of blocked resin.

The following Examples and Comparison Example are provided to better illustrate the present invention. All parts and percentages are by weight and all temperatures are in degrees Celsius unless explicitly stated otherwise.

EXAMPLE 1

898.0 grams propylene glycol monomethyl ether acetate (PGMEA), 200.2 grams of polyhydroxystyrene (PHS) ($M_w$ of approximately 8700), and 4.10 grams of 4,4'-isopropylidene dicyclohexanol (IPDCH) were added to a 2-liter resin kettle. The material in the kettle was heated to 60° C. under vacuum and 80.8 grams of liquid were stripped off. 80.8 grams of PGMEA were added to the kettle and then 63.2 grams of liquid were stripped off. The solution was cooled to 25° C. and 60.2 grams of t-butyl vinyl ether (TBVE) and 3.24 grams of PGMEA were added to the kettle. The water content of a sample taken at this point was 0.06 wt. %. 14.1 grams of a solution of 0.1 wt. % p-toluene sulfonic acid catalyst (PTSA) in PGMEA were added to the kettle and mixed for 17 hours and 35 minutes at 25° C. 0.92 grams of a solution of 1.0 wt. % triethylamine (TEA) in PGMEA, 168.2 grams acetone and 224.0 grams hexane were then added to the reaction mixture.

112.0 grams of deionized (DI) water were added to the kettle and the mixture was agitated for 5 minutes. Agitation was stopped and the mixture was allowed to settle for 135 minutes. 73.5 grams of the first bottom (aqueous) layer were removed. The separated aqueous phase contained water, TEA/PTSA salt; residual vinyl ether, water-soluble by-products; acetone; a small amount of PGMEA; and trace metals. A complete chemical and physical analysis was not done of this aqueous phase. The organic phase contained PGMEA, acetone, hexane, some water and blocked, crosslinked polyhydroxystyrene. A complete chemical and physical analysis of this organic phase was not done. 56.0 grams of acetone and 112.1 grams of DI water were added and the mixture was agitated for 5 minutes. Agitation was stopped and the mixture was allowed to settle for 70 minutes. 147.4 grams of the second bottom (aqueous) layer were removed. 34.2 grams of acetone and 112.0 grams of DI water were added and the mixture was agitated for 10 minutes. Agitation was stopped and the mixture was allowed to settle for 80 minutes. 154.8 grams of the third bottom (aqueous) layer were removed.

The remaining organic layer was stripped under vacuum in a rotary vacuum system at a bath temperature of 55° C. to give 620.5 grams of solution containing 0.078 wt. % water and 40.2 wt. % solids. Solids yield was about 98%, based on the solids in the solution and assumes that all of the PHS plus 85% of the IPDCH and 85% of the vinyl ether is in the solids. Product analysis showed a 26% blocking level, a molecular weight of 40,217 and relative crosslinking of 2.62.

EXAMPLE 2

730.0 grams PGMEA, 149.7 grams of PHS, and 6.12 grams IPDCH were added to a 2 liter resin kettle. The material in the kettle was heated to 60° C. under vacuum and 90.6 grams of liquid were stripped off. The solution was cooled to 180° C. and 38.7 grams of ethyl vinyl ether (EVE) and 20.6 grams of PGMEA were added to the kettle. Water content of sample taken at this point was 0.02 wt. %. 4.5 grams of a solution of 1.0 wt. % PTSA in PGMEA were added to the kettle and the kettle was mixed for 19 hours and 50 minutes at 180° C. 2.91 grams of a solution of 1.0 wt. % triethylamine in PGMEA, 421 grams acetone and 172.5 grams hexane were added to the reaction mixture.

172.0 grams of DI water were added to the kettle and the mixture was agitated for 10 minutes. Agitation was stopped and the mixture was allowed to settle for 70 minutes. 163.1 grams of the first bottom (aqueous) layer were removed. 86.0 grams of acetone, 25.9 grams of PGMEA and 86.0 grams of DI water were added and the mixture was agitated for 5 minutes. Agitation was stopped and the mixture was allowed to settle for 120 minutes. 134.4 grams of the second bottom (aqueous) layer were removed. 43.1 grams of acetone, 25.8 grams of PGMEA and 86.6 grams of DI water were added and the mixture was agitated for 5 minutes. Agitation was stopped and the mixture was allowed to settle for 70 minutes. 152.1 grams of the third bottom (aqueous) layer were removed.

The remaining organic layer was stripped under vacuum in a rotary vacuum system at a bath temperature of 50° C. to give 461.4 grams of solution containing 0.092 wt. % water and 39.6 wt. % solids. Solids yield was about 97%. Product analysis showed a 37% blocking level, a molecular weight of 47076 and relative crosslinking of 3.54 [relative crosslinking ($X_{rel}$) equals [the division product of total molecular weight of resin divided by molecular weight of uncrosslinked resin] minus one].

EXAMPLE 3

125.2 pounds of PGMEA, 27.0 pounds of PHS and 249.9 grams of IPDCH were added to a 30 gallon glass lined reactor. The reactor was heated to 60° C. under vacuum and 16.6 pounds of liquid were stripped off. The reactor was cooled to 20° C., and 3063 grams of TBVE, 86.2 grams of 1 wt. % PTSA in PGMEA, and 4.6 pounds of PGMEA were added. The mixture was agitated at 20° C. for 18 hours and 25 minutes. 55.7 grams of 1 wt. % triethylamine in PGMEA, 22.6 pounds of acetone and 29.0 pounds of hexane were added to the reactor.

15.1 pounds of DI water were added to the reactor and the mixture was agitated for 5 minutes. The agitator was stopped and the mixture was allowed to settle for 90 minutes. 7.3 pounds of the first bottom (aqueous) phase were removed from the reactor. 7.0 pounds of acetone and 15.9 pounds of DI water were added to the reactor and the mixture was agitated for 5 minutes. The agitator was stopped and the mixture was allowed to settle for 150 minutes. 19.4 pounds of the second bottom (aqueous) phase were removed from the reactor. 4.4 pounds of acetone and 15.4 pounds of DI water were added to the reactor and the mixture was agitated for 5 minutes. The agitation was stopped and the mixture was allowed to settle for 125 minutes. 21.7 pounds of the third bottom (aqueous) phase were moved from the reactor. 1506 grams of 0.5 wt. % triphenylimidazole (TPI) in PGMEA were added to the reactor.

The remaining organic phase was stripped under vacuum with a reactor jacket temperature of 60° C. until the solids concentration was 42.4 wt. %. 32.5 pounds of PGMEA were added to the reactor to give 108.6 pounds of polymer solution with 29.2 wt. % solids. Solids yield was about 95%. Product analysis showed a blocking level of 26%, a molecular weight of 47,977 and relative crosslinking of 2.82.

EXAMPLE 4

104.4 pounds of PGMEA, 21.0 pounds of PHS and 228.7 grams of IPDCH were added to a 30 gallon glass lined reactor. The reactor was heated to 60° C. under vacuum and 14.0 pounds of liquid were stripped off. The reactor was cooled to 18° C., and 4.66 pounds of EVE, 285.8 grams of 1 wt. % PTSA in PGMEA, and 2.0 pounds of PGMEA were added to the reactor. The mixture was agitated at 18° C. for 20 hours and 5 minutes. 184.6 grams of 1 wt. % triethylamine in PGMEA, 60.4 pounds of acetone and 24.0 pounds of hexane were added to the reactor.

24.0 pounds of DI water were added to the reactor and the mixture was agitated for 5 minutes. The agitator was stopped and the mixture was allowed to settle for 130 minutes. 20.8 pounds of the first bottom (aqueous) phase were removed from the reactor. 12.0 pounds of acetone, 4.1 pounds of PGMEA and 12.1 pounds of DI water were added to the reactor and the mixture was agitated for 10 minutes. The agitator was stopped and the mixture was allowed to settle for 132 minutes. 18.7 pounds of the second bottom (aqueous) phase were removed from the reactor. 4.3 pounds of acetone, 4.4 pounds of PGMEA and 12.0 pounds of DI water were added to the reactor and the mixture was agitated for 5 minutes. The agitator was stopped and the mixture was allowed to settle for 125 minutes. 19.8 pounds of the third bottom (aqueous) phase were removed from the reactor. 2.54 pounds of 0.5 wt. % 2,4,5-triphenylimidazole (TPI) in PGMEA were added to the reactor.

The remaining organic phase was stripped under vacuum with a reactor jacket temperature of 60° C. until the solids concentration was 39.4 wt. % 20.4 pounds of PGMEA were added to the reactor to give 78.2 pounds of polymer solution with about 30 wt. % solids. Solids yield was about 96%. Product analysis showed a blocking level of 34%, a molecular weight of 40,348 and relative crosslinking of 1.95.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall without the spirit and broad scope of the appended claims. All patent applications, patents, and other publications cited herein are incorporated by reference in their entirety.

What is claimed is:

1. A process for preparing a purified solution of blocked polyhydroxystyrene resin in reaction/photoresist solvent, comprising the steps of:

(1) forming an impure reaction solution comprising blocked polyhydroxystyrene resin and acidic catalyst in reaction/photoresist solvent;

(2) adding amine, at least one hydrophilic solvent, at least one hydrophobic solvent, and water to said impure reaction solution, thereby forming an aqueous phase comprising water, the hydrophilic solvent, and at least one salt of the amine and the acidic catalyst and an organic phase comprising the hydrophilic solvent, the hydrophobic solvent, the reaction/photoresist solvent and the blocked polyhydroxystyrene resin;

(3) separating the aqueous phase from the organic phase; and (4) removing the hydrophilic solvent and the hydrophobic solvent from the organic phase, thereby forming a purified solution of blocked polyhydroxystyrene resin in reaction/photoresist solvent.

2. The process of claim 1, wherein said separated organic phase of step (3) is subjected to at least one washing operation with water before step (4).

3. The process of claim 1, wherein said removing step (4) comprises simple distillation.

4. The process of preparing a chemically amplified photoresist comprising adding at least one photoacid generator to said purified solution of blocked, crosslinked polyhydroxystyrene resin prepared by the process of claim 3.

5. The process of claim 1, wherein said blocked polyhydroxystyrene resin is a blocked, crosslinked polyhydroxystyrene.

6. The process of claim 1, wherein said acidic catalyst is toluene sulfonic acid.

7. The process of claim 1, wherein said hydrophilic solvent is acetone.

8. The process of claim 1, wherein said hydrophobic solvent is hexane.

9. The process of claim 1, wherein said reaction/photoresist solvent is propylene glycol monomethyl ether acetate (PGMEA).

10. The process of claim 1, wherein said amine is triethylamine.

11. The process of preparing a chemically amplified photoresist comprising adding at least one photoacid generator to said purified solution of blocked polyhydroxystyrene resin prepared by the process of claim 1.

* * * * *